United States Patent
Kainuma

(10) Patent No.: US 11,121,063 B2
(45) Date of Patent: Sep. 14, 2021

(54) STEM

(71) Applicant: SHINKO ELECTRIC INDUSTRIES CO., LTD., Nagano (JP)

(72) Inventor: Masao Kainuma, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/596,956

(22) Filed: Oct. 9, 2019

(65) Prior Publication Data

US 2020/0118909 A1   Apr. 16, 2020

(30) Foreign Application Priority Data

Oct. 16, 2018   (JP) .............................. JP2018-195284

(51) Int. Cl.
  *H01L 23/48*   (2006.01)
  *H01L 23/498*  (2006.01)
  *H01L 33/62*   (2010.01)

(52) U.S. Cl.
  CPC ...... *H01L 23/481* (2013.01); *H01L 23/49811* (2013.01); *H01L 33/62* (2013.01)

(58) Field of Classification Search
  CPC ... H01L 23/481; H01L 23/49811; H01L 33/62
  See application file for complete search history.

(56) References Cited

U.S. PATENT DOCUMENTS

| | | | | |
|---|---|---|---|---|
| 2004/0037334 A1* | 2/2004 | Funada | ............... | H01S 5/02248 372/50.21 |
| 2004/0188698 A1* | 9/2004 | Ishimura | ............. | H01S 5/02212 257/99 |
| 2005/0025438 A1* | 2/2005 | Go | ........................ | G02B 6/4257 385/92 |

FOREIGN PATENT DOCUMENTS

JP   2011-049190   3/2011

\* cited by examiner

*Primary Examiner* — Feifei Yeung Lopez
(74) *Attorney, Agent, or Firm* — Rankin, Hill & Clark LLP

(57) ABSTRACT

A stem includes a base member that includes a main body, a raised portion raised from the top surface of the main body, and a through-hole through the main body, a lead that is inserted into the through-hole of the base member and is fixed to the through-hole with a fixing material such that one end of the lead juts out of the top surface of the main body of the base member, and a substrate that is inserted into a gap between the raised portion of the base member and one end of the lead and is attached to the raised portion to be electrically connected to the one end. The lead has a curved surface curving in a direction widening the gap into which the substrate is inserted, or an inclined surface inclined in a direction widening the gap, on a tip of the one end.

6 Claims, 4 Drawing Sheets

STEM

CROSS-REFERENCE TO RELATED APPLICATION

This application is based upon and claims the benefit of priority of the prior Japanese Patent Application No. 2018-195284, filed on Oct. 16, 2018, the entire contents of which are incorporated herein by reference.

FIELD

The embodiment discussed herein is related to a stem.

BACKGROUND

In a stem on which a semiconductor device such as an optical device is mounted, the stem including a disk-shaped base member having a raised portion that is raised from the disk shaped member, the base member having a through-hole through which a lead is passed, a substrate for implementing the semiconductor device is inserted into a gap between the raised portion and the lead, and the substrate and lead are electrically connected. The lead passed through the through-hole of the base member is then fixed to the through-hole with a fixing material such as glass. A related art example is disclosed in Japanese Laid-open Patent Publication No. 2011-49190.

The lead included in a stem generally has a sharp edge on the tip thereof because the lead is manufactured by cutting. Therefore, when the substrate is inserted into the gap between the raised portion of the base member and the lead passed through the through-hole of the base member, the substrate may get caught on the sharp edge on the tip of the lead. In particular, when the gap between the raised portion and the lead is narrow due to the way the lead is fixed to the through-hole, the substrate to be inserted into the gap can get caught on the tip of the lead more easily. As a result, insertability of the substrate may be reduced. For the stem, the reduced insertability of the substrate is not favorable because it worsens the stem assemblability.

SUMMARY

According to an aspect of an embodiment, a stem includes a base member that includes a main body, a raised portion raised from a top surface of the main body, and a through-hole through the main body in a thickness direction; a lead that is inserted into the through-hole of the base member and is fixed to the through-hole with a fixing material such that one end of the lead juts out of the top surface of the main body of the base member; and a substrate that is inserted into a gap between the raised portion of the base member and the one end of the lead and is attached to the raised portion to be electrically connected to the one end, wherein the lead has a curved surface curving in a direction widening the gap into which the substrate is inserted, or an inclined surface inclined in a direction widening the gap, on a tip of the one end.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
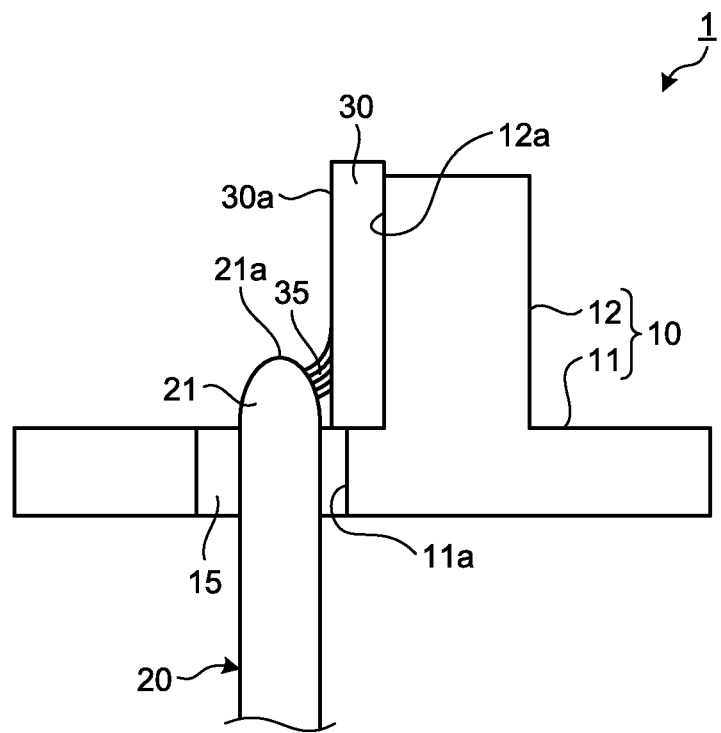
FIG. 1 is a schematic sectional view illustrating one example of a structure of a stem according to an embodiment.

A stem according to an embodiment of the present invention will now be explained in detail with reference to some drawings. This embodiment is, however, not intended to limit the scope of the present invention in any way. In the embodiment, the elements having the same functions will be given the same reference numerals, and redundant explanations thereof will be omitted.

Structure of Stem

FIG. 1 is a schematic sectional view illustrating one example of a structure of a stem 1 according to an embodiment. As illustrated in FIG. 1, the stem 1 includes a base member 10, a lead 20, and a substrate 30.

The base member 10 is a base member that is made of metallic material, for example, and that has elements such as the lead 20 and the substrate 30 mounted thereon. The base member 10 includes a main body 11, and a raised portion 12 that is raised from the top surface of the main body 11.

The main body 11 has a disk-like shape, for example. A through-hole 11a through the main body 11 in the thickness direction is provided to the main body 11.

The raised portion 12 is formed in a semi-columnar shape with a flat side surface facing the through-hole 11a side, for example. The side surface of the raised portion 12 facing the through-hole 11a side serves as an attachment surface 12a to which the substrate 30 is attached.

The lead 20 has a columnar shape, for example, and transmits electric signals. The lead 20 is passed through the through-hole 11a of the base member 10, and is fixed to the through-hole 11a with a fixing material 15. The fixing material 15 covers and seals a part of the outer circumferential surface of the lead 20, the part being the part corresponding to the through-hole 11a. The fixing material 15 has a function for ensuring the insulation of the lead 20 from the base member 10, and a function for fixing the lead 20 to the through-hole 11a. As a material for the fixing material 15, glass, an insulating resin, or the like is used.

Furthermore, the lead 20 has an upper end 21 jutting out of the top surface of the main body 11 of the base member 10. Because the lead 20 has the upper end 21 jutting out of the top surface of the main body 11, a gap having a predetermined width is formed between the raised portion 12 of the base member 10 and the upper end 21 of the lead 20. The substrate 30 is then inserted into this gap. Hereinafter, the gap between the raised portion 12 of the base member 10 and the upper end 21 of the lead 20 will be referred to as "a gap into which the substrate 30 is inserted", as appropriate.

The lead 20 has, on the tip of the upper end 21 thereof, a curved surface 21a curving in a direction widening the gap into which the substrate 30 is inserted. In other words, the lead 20 has a curved surface 21a that becomes closer to the central axis of the lead 20 as the curved surface 21a extends nearer to the tip of the upper end 21. For example, a curved surface 21a having a semi-spherical shape is provided to the tip of the upper end 21 of the lead 20. The curved surface 21a with a semi-spherical shape is formed by applying barrel processing to the upper end 21 that is resultant of cutting the lead 20, for example.

The substrate 30 is a substrate on which a semiconductor device is implemented, and is inserted into the gap between the raised portion 12 of the base member 10 and the upper end 21 of the lead 20, so as to be attached to the raised portion 12. For example, the substrate 30 is attached to the raised portion 12 by bonding a rear surface thereof with respect to a front surface 30a, on which the semiconductor device is implemented, to the attachment surface 12a of the raised portion 12, using a brazing filler material such as a gold-tin alloy.

Furthermore, the substrate 30 is electrically connected to the upper end 21 of the lead 20. For example, the substrate 30 is electrically connected to the upper end 21 of the lead 20 by bonding the upper end 21 of the lead 20 to a conductor pattern (not illustrated) on the front surface 30a on which the semiconductor device is implemented, using a brazing filler material 35 such as a gold-tin alloy.

In the stem 1, the tip of the lead 20 generally has a sharp edge because the lead 20 is manufactured by cutting. Therefore, when the substrate 30 is inserted into the gap between the raised portion 12 of the base member 10 and the upper end 21 of the lead 20, the substrate 30 sometimes gets caught on the sharp edge on the tip of the lead 20. In particular, when the gap between the raised portion 12 and the upper end 21 of the lead 20 is narrow due to the way the lead 20 is fixed to the through-hole 11a of the base member 10, the substrate 30 to be inserted into the gap may get caught on the edge on the tip of the lead 20 more easily. As a result, insertability of the substrate 30 may be reduced.

As illustrated in FIG. 1, in the stem 1 according to the embodiment, the curved surface 21a curving in a direction widening the gap into which the substrate 30 is inserted is provided to the tip of the upper end 21 of the lead 20. This configuration prevents, when the substrate 30 is inserted into the gap between the raised portion 12 of the base member 10 and the upper end 21 of the lead 20, the substrate 30 to be inserted into the gap from being brought into contact with the tip of the upper end 21 of the lead 20, so that the substrate 30 is inserted into the gap smoothly. Furthermore, even if the substrate 30 is brought into contact with the upper end 21 of the lead 20, the curved surface 21a provided to the tip of the upper end 21 of the lead 20 smoothly guides the substrate 30 into the gap between the raised portion 12 of the base member 10 and the upper end 21 of the lead 20. As a result, it is possible to improve the insertability of the substrate 30.

Figure 2:
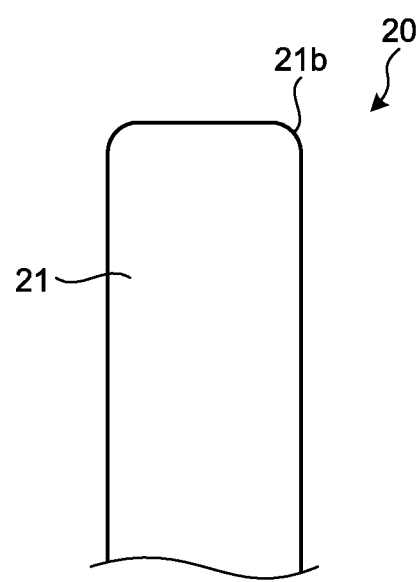
FIG. 2 is a schematic diagram illustrating an example 1 in which a curved surface that is a rounded edge is provided to the tip of an upper end of a lead.

While in the explanation above an example is used in which the curved surface 21a having a semi-spherical shape is provided to the tip of the upper end 21 of the lead 20, the shape of the curved surface is not limited to a semi-spherical shape. For example, a curved surface that is a rounded edge may be provided to the tip of the upper end 21 of the lead 20. FIG. 2 is a schematic illustrating an example 1 in which a curved surface that is a rounded edge is provided to the tip of the upper end 21 of the lead 20. In the lead 20 illustrated in FIG. 2, the tip of the upper end 21 has a curved surface 21b that is a rounded edge. The curved surface 21b that is a rounded edge is provided by etching the upper end 21 resultant of cutting the lead 20, for example.

Figure 3:
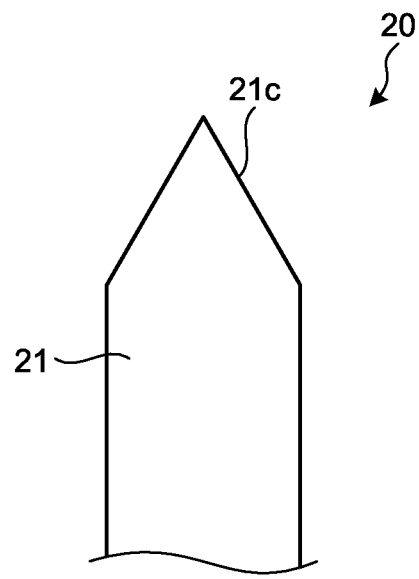
FIG. 3 is a schematic diagram illustrating an example 2 in which a conical inclined surface is provided to the tip of the upper end of the lead.

Furthermore, in the lead 20, the tip of the upper end 21 may have an inclined surface that is inclined in a direction widening the gap into which the substrate 30 is inserted, instead of the curved surface 21a. For example, a conical inclined surface may be provided to the tip of the upper end 21 of the lead 20. FIG. 3 is a schematic diagram illustrating an example 2 in which a conical inclined surface is provided to the tip of the upper end 21 of the lead 20. In the lead 20 illustrated in FIG. 3, the tip of the upper end 21 has a conical inclined surface 21c. The conical inclined surface 21c is formed by machining the upper end 21 resultant of cutting the lead 20, for example.

Figure 4:
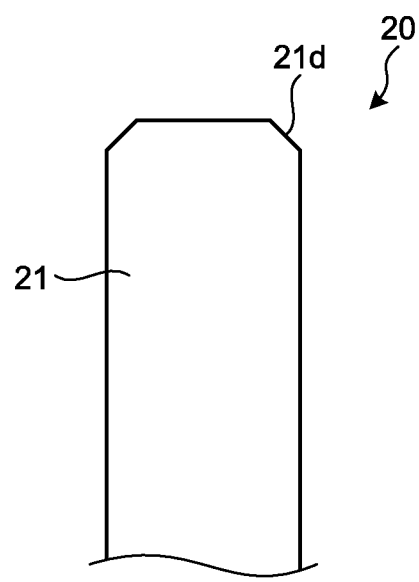
FIG. 4 is a schematic diagram illustrating an example 3 in which an inclined surface that is a flattened edge is provided to the tip of the upper end of the lead.

Furthermore, an inclined surface that is a flattened edge may be provided to the tip of the lead 20. FIG. 4 is a schematic diagram illustrating an example 3 in which an inclined surface that is a flattened edge is provided to the tip of the upper end 21 of the lead 20. In the lead 20 illustrated in FIG. 4, the tip of the upper end 21 has an inclined surface 21d that is a flattened edge. The inclined surface 21d that is a flattened edge is formed by chamfering the upper end 21 resultant of cutting the lead 20, for example.

Stem Manufacturing Method

The stem 1 illustrated in FIG. 1 may be manufactured using a manufacturing method explained below, for example. To begin with, a base member 10 that is an integration of the main body 11 and the raised portion 12 is fabricated by pressing a metallic material using a cold forging press or the like. A tubular body is then fabricated by forming a glass material, for example. The tubular body is then fitted into the through-hole 11a of the main body 11 of the base member 10, and the lead 20 is inserted into the hole of the tubular body. The tubular body is then heated and molten, and the molten tubular body is then cooled and solidified. In this manner, a part of the outer circumferential surface of the lead 20, the part being the part corresponding to the through-hole 11a, is sealed with the fixing material 15, and the lead 20 is fixed to the through-hole 11a with the fixing material 15. The substrate 30 is then inserted into the gap between the raised portion 12 of the base member 10 and the upper end 21 of the lead 20. In the stem 1 according to the embodiment, the curved surface 21a curving in a direction widening the gap into which the substrate 30 is inserted is provided to the tip of the upper end 21 of the lead 20. This configuration prevents, when the substrate 30 is inserted into the gap between the raised portion 12 of the base member 10 and the upper end 21 of the lead 20, the substrate 30 to be inserted into the gap from being brought into contact with the tip of the upper end 21 of the lead 20, so that the substrate 30 is inserted into the gap smoothly. Furthermore, even if the substrate 30 is brought into contact with the upper end 21 of the lead 20, the curved surface 21a provided to the tip of the upper end 21 of the lead 20 smoothly guides the substrate 30 into the gap between the raised portion 12 of the base member 10 and the upper end 21 of the lead 20. The substrate 30 is then attached to the raised portion 12 by bonding the rear surface of the substrate 30 to the attachment surface 12a of the raised portion 12, using a brazing filler material such as a gold-tin alloy. The substrate 30 is then electrically connected to the upper end 21 of the lead 20 by bonding the upper end 21 of the lead 20 to the conductor pattern on the front surface 30a on which the semiconductor device is implemented in the substrate 30, with the brazing filler material 35 such as a gold-tin alloy. In the manner described above, the stem 1 illustrated in FIG. 1 is manufactured.

Actions and Advantageous Effects

Figure 5:
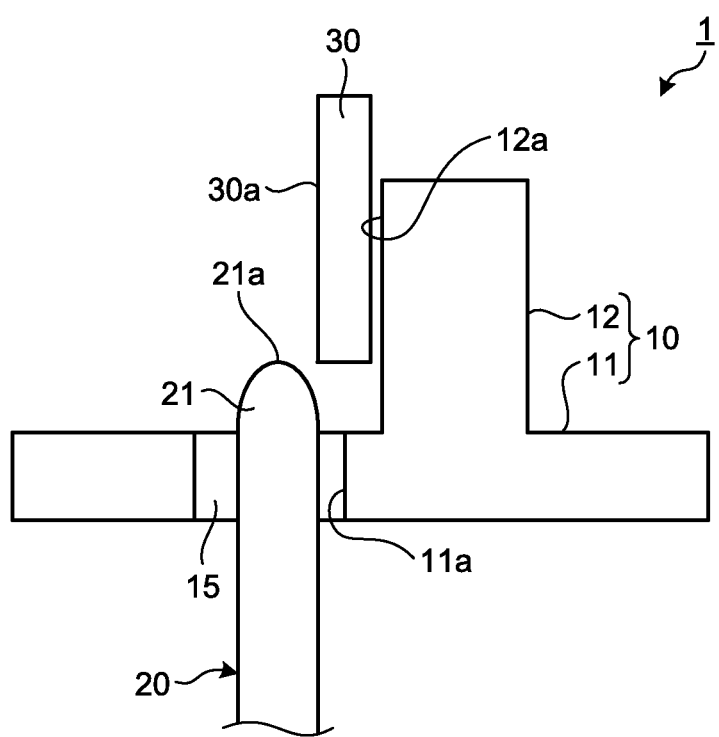
FIG. 5 is an explanatory schematic diagram illustrating one example of a process for inserting a substrate into a gap between a raised portion of a base member and the upper end of the lead.

Actions and advantageous effects achieved by the stem 1 according to the embodiment will now be explained. FIG. 5 is an explanatory schematic illustrating one example of a process for inserting the substrate 30 into the gap between the raised portion 12 of the base member 10 and the upper end 21 of the lead 20. In the stem 1, the curved surface 21a curving in a direction widening the gap into which the substrate 30 is inserted is provided to the tip of the upper end 21 of the lead 20. This configuration prevents, as illustrated in FIG. 5, when the substrate 30 is inserted into the gap between the raised portion 12 of the base member 10 and the upper end 21 of the lead 20, the substrate 30 to be inserted into the gap from being brought into contact with the tip of the upper end 21 of the lead 20, so that the substrate 30 is inserted into the gap smoothly. Furthermore, even if the substrate 30 is brought into contact with the upper end 21 of the lead 20, the curved surface 21a provided to the tip of the upper end 21 of the lead 20 smoothly guides the substrate 30 into the gap between the raised portion 12 of the base member 10 and the upper end 21 of the lead 20. As a result, it is possible to improve the insertability of the substrate 30.

Figure 6:
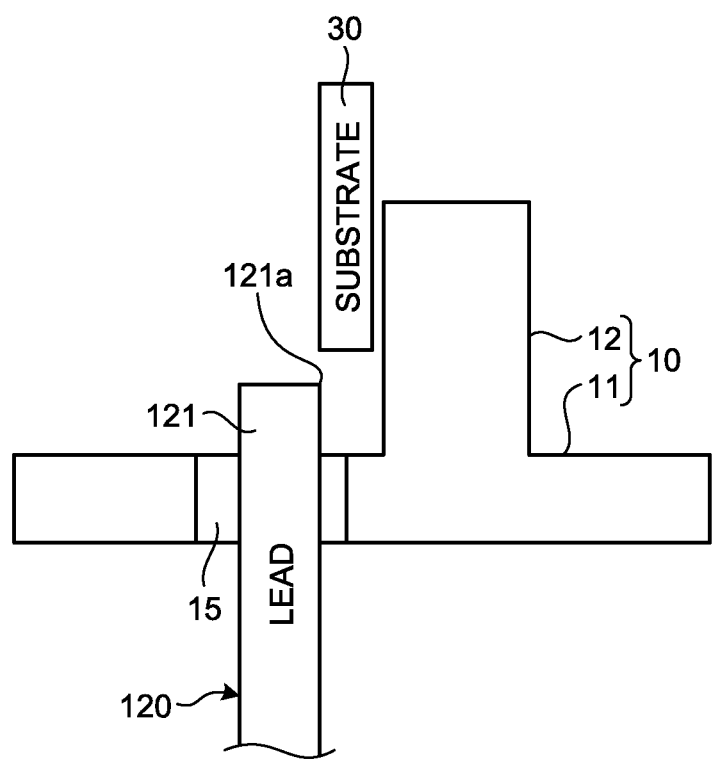
FIG. 6 is a schematic diagram illustrating one example of a structure according to a comparative example.

Some advantageous effects will now be explained using a comparative example. FIG. 6 is a schematic illustrating one example of a structure according to a comparative example. In a lead 120 according to the comparative example illustrated in FIG. 6, the tip of an upper end 121 has a sharp edge 121a. In the lead 120 according to the comparative example of in which the tip of the upper end 121 has the sharp edge 121a, when the substrate 30 is inserted into the gap between the raised portion 12 of the base member 10 and the upper end 121 of the lead 120, the substrate 30 may get caught on the sharp edge 121a. As a result, insertability of the substrate 30 may be reduced. The reduced insertability of the substrate 30 is not favorable because it worsens the assemblability of the stem 1.

By contrast, in the stem 1 according to the embodiment, the curved surface 21a curving in a direction widening the gap into which the substrate 30 is inserted is provided to the tip of the upper end 21 of the lead 20. This configuration prevents the substrate 30 to be inserted into the gap from being brought into contact with the tip of the upper end 21 of the lead 20. Otherwise, the substrate 30 is guided smoothly by the curved surface 21a into the gap between the raised portion 12 of the base member 10 and the upper end 21 of the lead 20. As a result, the insertability of the substrate 30 into the gap can be improved.

As described above, the stem 1 according to the embodiment includes the base member 10, the lead 20, and the substrate 30. The base member 10 includes the main body 11, the raised portion 12 raised from the top surface of the main body 11, and the through-hole 11a through the main body 11 in the thickness direction. The lead 20 is inserted into the through-hole 11a of the base member 10, and fixed to the through-hole 11a with the fixing material 15 such that the upper end 21 juts out of the top surface of the main body 11 of the base member 10. The substrate 30 is inserted into the gap between the raised portion 12 of the base member 10 and the upper end 21 of the lead 20, attached to the raised portion 12, and is electrically connected to the upper end 21. The lead 20 has a curved surface curving in a direction widening the gap into which the substrate 30 is inserted (e.g., the curved surface 21a or the curved surface 21b), or an inclined surface that is inclined in the direction widening the gap into which the substrate 30 is inserted (e.g., the inclined surface 21c or the inclined surface 21d), on the tip of the upper end 21. In this manner, it is possible to improve the insertability of the substrate 30.

Various types of embodiment are explained above, but the technology according to the present invention is not limited to the embodiment described above, and it is possible to configure various modified forms. For example, in the lead 20, a curved surface having the same shape as that of the curved surface 21a or the curved surface 21b may be provided to the tip of a bottom end that is positioned on the opposite side of the upper end 21. Alternatively, in the lead 20, an inclined surface having the same shape as that of the inclined surface 21c or the inclined surface 21d may be provided to the tip of the bottom end that is positioned on the opposite side of the upper end 21. In this manner, it is possible to improve the insertability of the substrate 30, even when either one of the two ends of the lead 20 is inserted into the through-hole 11a of the base member 10.

The stem according to one aspect of the present invention advantageously improves insertability of the substrate.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A stem comprising:
   a base member that includes a main body, a raised portion raised from a top surface of the main body, and a through-hole through the main body in a thickness direction;
   a lead that is inserted into the through-hole of the base member and is fixed to the through-hole with a fixing material such that one end of the lead juts out from the top surface of the main body of the base member; and
   a substrate that is inserted into a gap between the raised portion of the base member and the one end of the lead and is attached to the raised portion to be electrically connected to the one end,
   wherein the lead has, on the one end, a curved surface curving in a direction widening the gap into which the substrate is inserted, the curved surface becoming closer to a central axis of the lead from an outer peripheral surface of the lead that is extended in a direction parallel to the central axis of the lead as the curved surface extends further from the top surface of the main body and becomes closest to the central axis of the lead at the tip of the one end, or an inclined surface inclined in a direction widening the gap, the inclined surface becoming closer to the central axis of the lead as the inclined surface extends further from the top surface of the main body and becomes closest to the central axis of the lead at the tip of the one end.

2. The stem according to claim 1, wherein the lead has the curved surface having a semi-spherical shape, on the one end.

3. The stem according to claim 1, wherein the lead has the curved surface that is a rounded edge, on the one end.

4. The stem according to claim 1, wherein the lead has the inclined surface having a conical shape, on the tip of the one end.

5. The stem according to claim 1, wherein the lead has the inclined surface that is a flattened edge, on the one end.

6. The stem according to claim 1, wherein the lead has a curved surface or an inclined surface having a same shape as the curved surface or the inclined surface, on another end that is positioned on an opposite side of the one end.

* * * * *